| (12) | United States Patent | (10) Patent No.: | US 11,028,526 B2 |
|---|---|---|---|
| | Lee et al. | (45) Date of Patent: | Jun. 8, 2021 |

(54) CLOTHES CARE APPARATUS

(71) Applicant: Samsung Electronics Co., Ltd., Suwon-si (KR)

(72) Inventors: Dong Bum Lee, Suwon-si (KR); Sang Jin Kim, Suwon-si (KR); Eung Ryeol Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/537,260

(22) Filed: Aug. 9, 2019

(65) Prior Publication Data

US 2020/0048820 A1 Feb. 13, 2020

(30) Foreign Application Priority Data

Aug. 9, 2018 (KR) .......................... 10-2018-0093406

(51) Int. Cl.
| | |
|---|---|
| *D06F 58/30* | (2020.01) |
| *H05K 7/20* | (2006.01) |
| *D06F 58/10* | (2006.01) |
| *H05K 5/03* | (2006.01) |
| *H05K 7/14* | (2006.01) |

(52) U.S. Cl.
CPC .............. *D06F 58/30* (2020.02); *D06F 58/10* (2013.01); *H05K 5/03* (2013.01); *H05K 7/1427* (2013.01); *H05K 7/20145* (2013.01); *H05K 7/20172* (2013.01)

(58) Field of Classification Search
CPC ........... D06F 58/30; D06F 58/10; H05K 5/03; H05K 7/1427; H05K 7/20145; H05K 7/20172

USPC .............................................. 34/90, 595–610
See application file for complete search history.

(56) References Cited

U.S. PATENT DOCUMENTS 5,564,831 A * 10/1996 Bashark ............. G01R 31/2825
374/141
5,752,323 A * 5/1998 Hashimoto ............. D06F 58/10
34/80

(Continued)

FOREIGN PATENT DOCUMENTS

| EP | 3162952 A1 * | 5/2017 | ............. D06F 25/00 |
| JP | H07265138 A | 10/1995 | |

(Continued)

OTHER PUBLICATIONS

International Search Report dated Nov. 22, 2019 in connection with International Patent Application No. PCT/KR2019/009896, 3 pages.

*Primary Examiner* — Stephen M Gravini

(57) ABSTRACT

A clothes care apparatus capable of improving cooling performance of a printed circuit board assembly includes a body, a first chamber provided inside the body and configured to receive clothes, a second chamber provided inside the body but separated from the first chamber, a printed circuit board housing configured to form one side wall of the second chamber and provided with a receiving space separated from the second chamber in the second chamber, the receiving space to which air outside the body flows, and a printed circuit board assembly arranged in the receiving space to be cooled by air flowing into the receiving space from the outside of the body.

20 Claims, 10 Drawing Sheets

(56) References Cited

U.S. PATENT DOCUMENTS

| | | | |
|---|---|---|---|
| 7,146,749 B2 * | 12/2006 | Barron | D06F 35/00 |
| | | | 34/596 |
| 7,762,007 B2 * | 7/2010 | Guinibert | D06F 37/302 |
| | | | 34/601 |
| 8,682,735 B2 * | 3/2014 | Ebrom | G06Q 30/0611 |
| | | | 705/26.1 |
| 9,103,061 B2 * | 8/2015 | Jeffery | D06F 33/00 |
| 9,803,313 B2 * | 10/2017 | Ryoo | D06F 58/30 |
| 10,337,137 B2 | 7/2019 | Jung et al. | |
| 10,676,859 B2 * | 6/2020 | Vitali | D06F 58/30 |
| 10,704,189 B2 * | 7/2020 | Christensen | D06F 25/00 |
| 2007/0220776 A1 * | 9/2007 | Guinibert | D06F 58/02 |
| | | | 34/603 |
| 2011/0005097 A1 | 1/2011 | Moon et al. | |
| 2018/0142408 A1 | 5/2018 | Ahn et al. | |
| 2019/0062985 A1 * | 2/2019 | Christensen | D06F 58/26 |
| 2020/0048820 A1 * | 2/2020 | Lee | D06F 34/08 |
| 2020/0256006 A1 * | 8/2020 | Vitali | D06F 25/00 |

FOREIGN PATENT DOCUMENTS

| | | | | |
|---|---|---|---|---|
| JP | 2006158586 A | 6/2006 | | |
| JP | 2010131262 A | 6/2010 | | |
| JP | 2015-039465 A | 3/2015 | | |
| KR | 10-2009-0014054 A | 2/2009 | | |
| KR | 10-2016-0149851 A | 12/2016 | | |
| KR | 10-2017-0006556 A | 1/2017 | | |
| KR | 10-2017-0016745 A | 2/2017 | | |
| WO | WO-2017072016 A1 * | 5/2017 | | D06F 58/30 |
| WO | WO-2018121850 A1 * | 7/2018 | | D06F 33/00 |
| WO | WO-2020032584 A1 * | 2/2020 | | H05K 7/20172 |

* cited by examiner

CLOTHES CARE APPARATUS

CROSS-REFERENCE TO RELATED APPLICATIONS

This application is based on and claims priority under 35 U.S.C. § 119 to Korean Patent Application No. 10-2018-0093406, filed on Aug. 9, 2018, in the Korean Intellectual Property Office, the disclosure of which is incorporated by reference herein in its entirety

BACKGROUND

1. Field

The disclosure relates to a clothes care apparatus capable of improving cooling performance of a printed circuit board assembly.

2. Description of Related Art

A clothes care apparatus is a type of device performing clothes care such as drying wet clothes, removing dust attached to clothes or eliminating remaining odors in clothes and smoothing wrinkles in clothes.

The clothes care apparatus may include a body provided with a clothes care compartment in which clothes is stored and cared, a door configured to open and close the clothes care compartment, and a machine room in which a variety of components are placed. In the machine room, a compressor and a heat exchanger for supplying dry air to clothes, and a steam generator for supplying steam to clothes may be placed. A printed circuit board assembly configured to control a variety of components of the clothes care apparatus may be also placed in the machine room.

Heat is generated in the compressor, the steam generator, and the printed circuit board assembly in the machine room. Particularly, a large amount of heat is generated in the printed circuit board assembly, and the printed circuit board assembly is vulnerable to the heat. Therefore, the printed circuit board assembly is separated from the compressor and the steam generator to prevent the increase in the temperature of the printed circuit board assembly caused by the heat generated by the compressor and the steam generator.

Further, because a short circuit may occur in the printed circuit board assembly due to moisture, moisture is prevented from flowing to the printed circuit board assembly. In addition, it is convenient to have easy access to the printed circuit board for repairing or replacing the printed circuit board assembly.

SUMMARY

Therefore, it is an aspect of the present disclosure to provide a clothes care apparatus capable of improving cooling performance of a printed circuit board assembly.

It is another aspect of the present disclosure to provide a clothes care apparatus capable of preventing moisture from flowing to the printed circuit board assembly.

It is another aspect of the present disclosure to provide a clothes care apparatus capable of reducing noise caused by components in a machine room.

It is another aspect of the present disclosure to provide a clothes care apparatus having easy access to a printed circuit board assembly.

Additional aspects of the present disclosure will be set forth in part in the description which follows and, in part, will be obvious from the description, or may be learned by practice of the present disclosure.

In accordance with an aspect of the disclosure, a clothes care apparatus includes a body, a first chamber provided inside the body and configured to receive clothes, a second chamber provided inside the body but separated from the first chamber, a printed circuit board housing configured to form one side wall of the second chamber and provided with a receiving space separated from the second chamber in the second chamber, the receiving space to which air outside the body flows, and a printed circuit board assembly arranged in the receiving space to be cooled by air flowing into the receiving space from the outside of the body.

The printed circuit board housing may include a first housing configured to form one side wall of the second chamber, and a second housing configured to form the receiving space by being coupled to the first housing and configured to separate the receiving space from the second chamber.

The first housing may include a first air inlet configured to allow air outside the body to flow into the receiving space, and a second air inlet configured to allow air outside the body to flow into the second chamber.

The printed circuit board assembly may include a printed circuit board having a mounting surface, and the printed circuit board may be arranged such a way that the mounting surface faces the first housing.

By separating the receiving space from the second chamber, the second housing may prevent heat of the second chamber from being transmitted to the receiving space.

The clothes care apparatus may further include a first cover member arranged between the printed circuit board assembly and the first housing to cover one surface of the printed circuit board assembly.

The first cover member may be formed of an insulating material to prevent a current from flowing from the printed circuit board assembly to the first housing.

The first cover member may include a plurality of holes configured to allow air to smoothly flow into the printed circuit board assembly in the receiving space.

The clothes care apparatus may further include a second cover member arranged between the printed circuit board assembly and the second housing to cover the other surface opposite to the one surface of the printed circuit board assembly.

The second cover member may be formed of an insulating material to prevent a current from flowing from the printed circuit board assembly to the second housing.

The first housing further may include an air outlet arranged above the first air inlet and configured to allow air of the receiving space to be discharged to the outside of the body.

The clothes care apparatus may further include a sealing member arranged between the first housing and the second housing to prevent moisture from flowing to the receiving space The clothes care apparatus may further include a fan arranged in the receiving space and configured to suction air outside the body into the receiving space through the first air inlet.

The second chamber may receive a compressor or a steam generator.

The printed circuit board assembly may include an inverter circuit configured to change a driving speed of the compressor by a frequency conversion.

The second housing may be formed of an insulating material to prevent a current from flowing from the printed circuit board assembly to the second housing.

When the first housing is separated from the body, the printed circuit board assembly and the first cover member may be exposed to the rear side of the body to allow access from the rear side of the body.

In accordance with another aspect of the disclosure, a clothes care apparatus includes a body, a first chamber provided inside the body, a second chamber provided inside the body but under the first chamber, a printed circuit board housing arranged in the second chamber to form a receiving space separated from the second chamber, the printed circuit board housing provided with a first air inlet configured to flow air outside the body into the receiving space and a second air inlet configured to flow air outside the body into the second chamber, and a printed circuit board assembly arranged in the receiving space.

The printed circuit board housing may include a first housing configured to form a rear wall of the second chamber, and a second housing configured to form the receiving space by being coupled to the first housing and configured to insulate the receiving space from the second chamber.

The first air inlet may include a plurality of first air inlets.

The second air inlet may include a plurality of second air inlets.

The number of the plurality of first air inlets may be greater than the number of the plurality of second air inlets.

The printed circuit board assembly may be arranged to face the first housing so that when the first housing is separated from the body, the printed circuit board assembly is exposed to the rear side of the body.

In accordance with another aspect of the disclosure, a clothes care apparatus includes an outer cabinet, a first chamber provided with an open front surface and configured to receive clothes, an inner cabinet arranged inside the outer cabinet and including the first chamber, a second chamber formed between the outer cabinet and the inner cabinet and provide with an open rear surface, a first housing configured to cover the open rear side of the second chamber to form a rear wall of the second chamber, a second housing coupled to the first housing to form a receiving space separated from the second chamber, and a printed circuit board assembly arranged in the receiving space to face the first housing.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
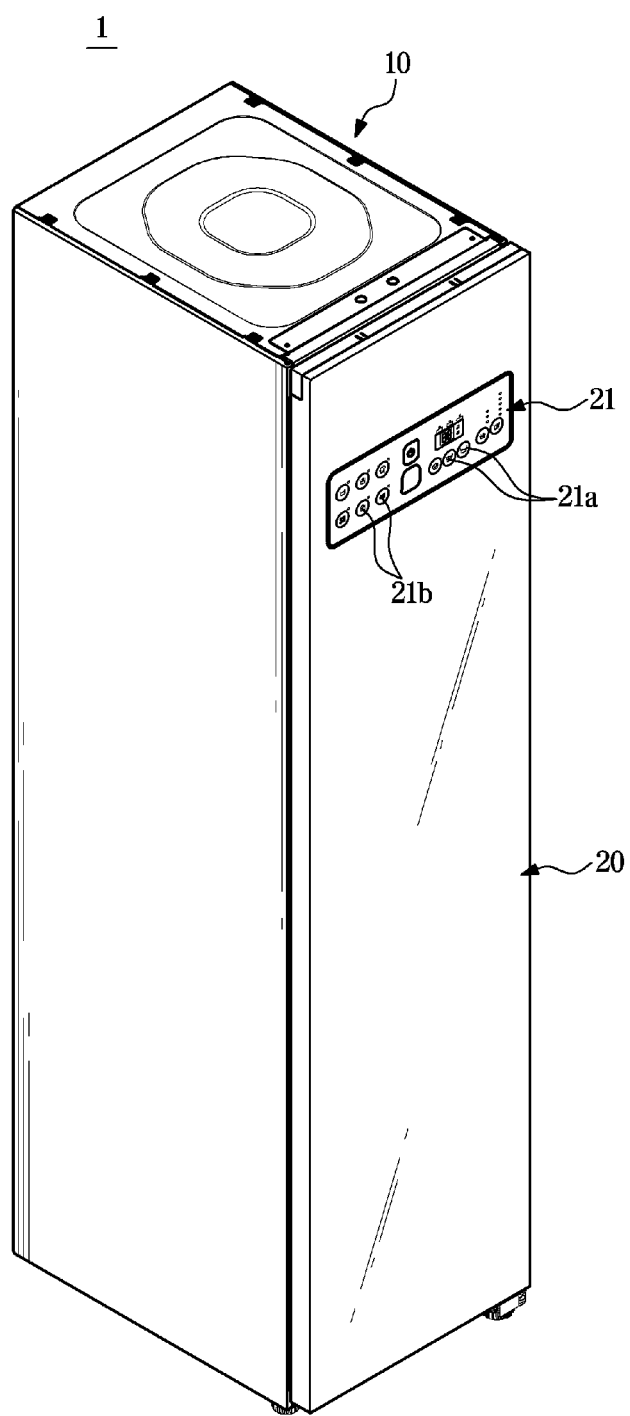
FIG. 1 illustrates a perspective view of a clothes care apparatus according to an embodiment of the disclosure.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments described in the present disclosure and configurations shown in the drawings are merely examples of the embodiments of the present disclosure, and may be modified in various different ways at the time of filing of the present application to replace the embodiments and drawings of the present disclosure.

Also, the terms used herein are used to describe the embodiments and are not intended to limit and/or restrict the present disclosure. The singular forms "a," "an" and "the" are intended to include the plural forms as well, unless the context clearly indicates otherwise. In this present disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the present disclosure, a first element may be termed as a second element, and a second element may be termed as a first element. The term of "and/or" includes a plurality of combinations of relevant items or any one item among a plurality of relevant items.

The present disclosure will be described more fully hereinafter with reference to the accompanying drawings Hereinafter a clothes care compartment may refer to a first chamber. A machine room may refer to a second chamber.

Figure 2:
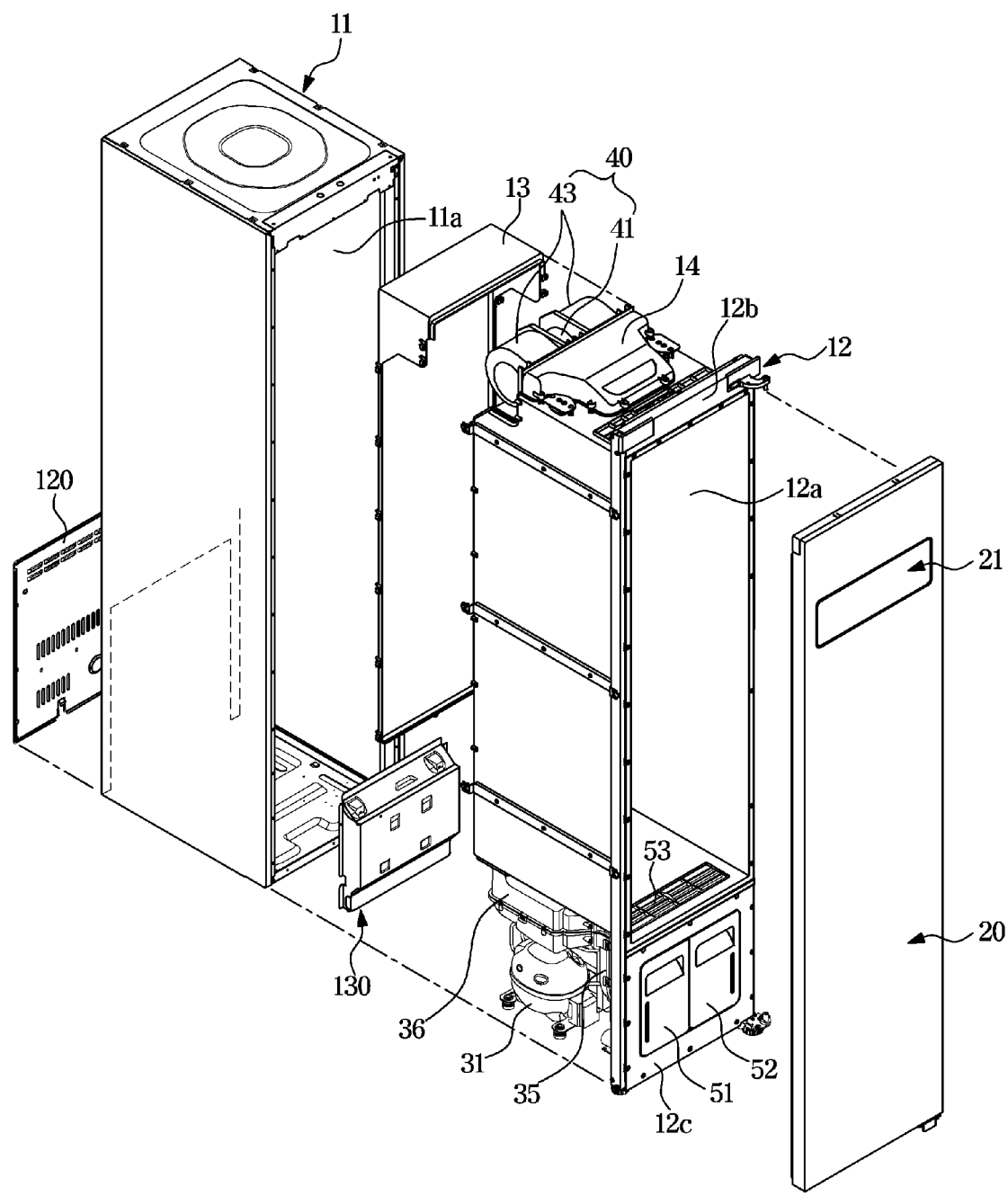
FIG. 2 illustrates an exploded perspective view of the clothes care apparatus according to the embodiment of the disclosure.
Figure 3:
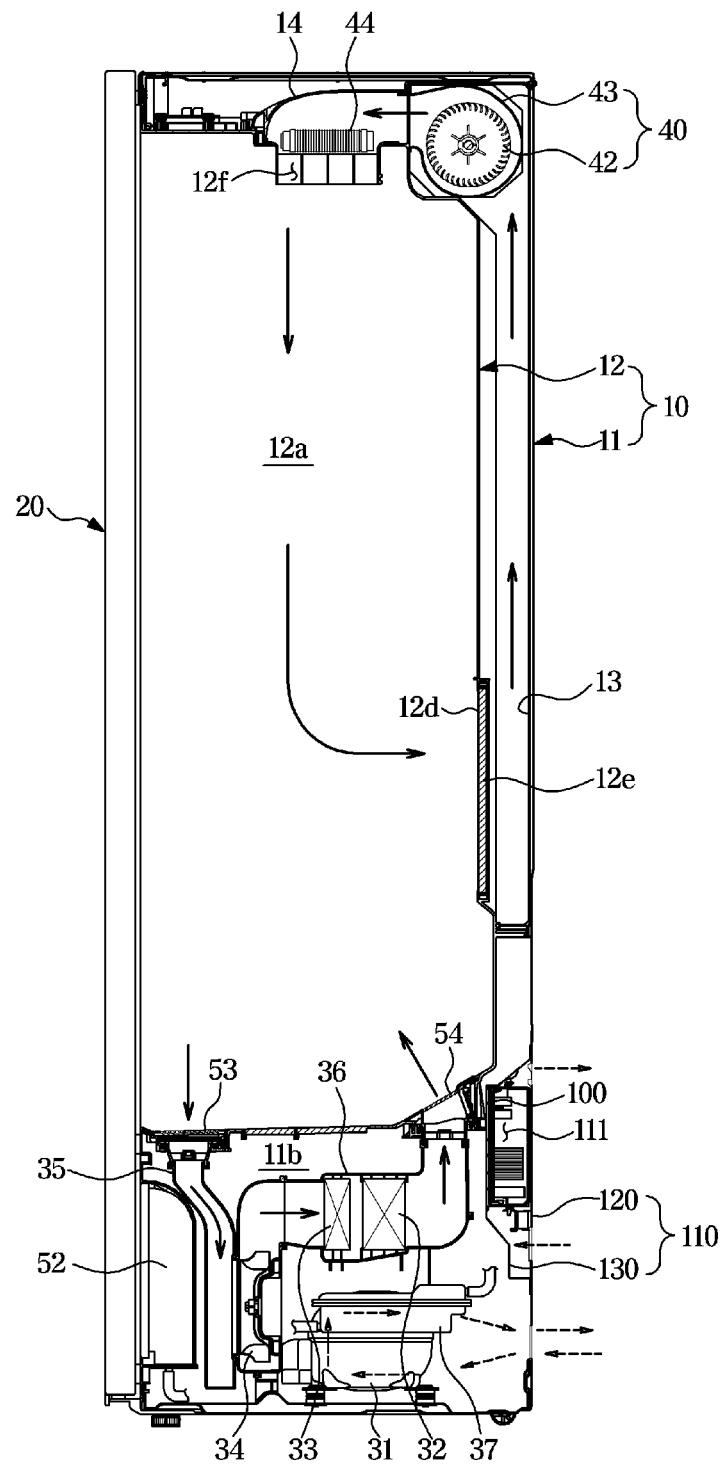
FIG. 3 illustrates a cross-sectional side view of the clothes care apparatus according to the embodiment of the disclosure.
Figure 4:
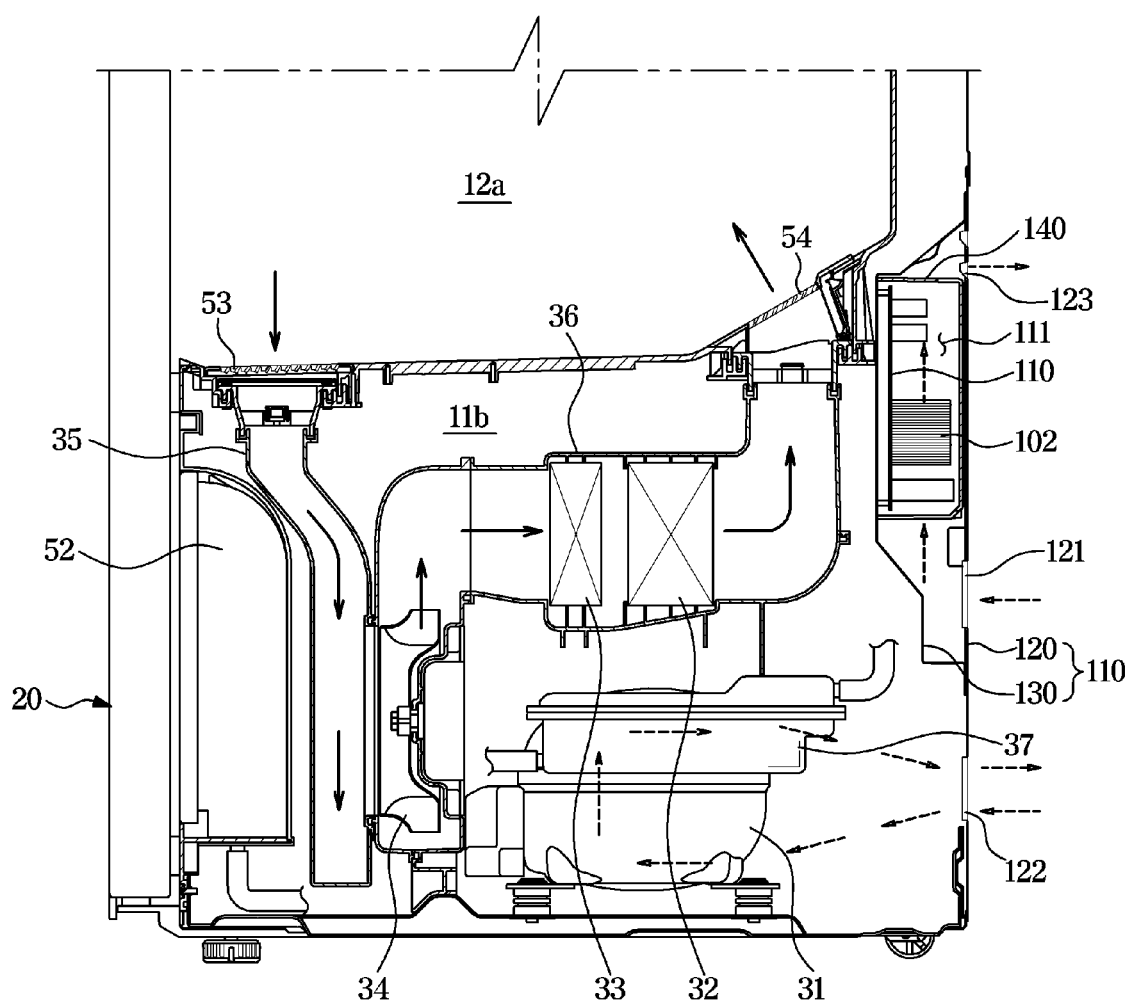
FIG. 4 illustrates an enlarged view of a part of FIG. 3.

FIG. 1 illustrates a perspective view of a clothes care apparatus according to an embodiment of the disclosure. FIG. 2 illustrates an exploded perspective view of the clothes care apparatus according to the embodiment of the disclosure. FIG. 3 illustrates a cross-sectional side view of the clothes care apparatus according to the embodiment of the disclosure. FIG. 4 illustrates an enlarged view of a part of FIG. 3.

As illustrated in FIGS. 1 and 2, a clothes care apparatus 1 may include a body 10, a clothes care compartment 12a provided in the body 10 to receive and care the clothes, and a door 20 configured to open and close the clothes care compartment 12a by being rotatably coupled to the body 10.

The body 10 may include an outer cabinet 11, an inner cabinet 12 installed inside the outer cabinet 11, and upper ducts 13 and 14 placed between the outer cabinet 11 and the inner cabinet 12 to guide air to circulate the air.

The outer cabinet 11 may be provided in a rectangular parallelepiped shape having a front surface opened to have an inner space 11a.

The inner cabinet 12 may be placed in the inner space 11a of the outer cabinet 11. The inner cabinet 12 may be placed in the inner space 11a to partition a machine room 11b. The inner cabinet 12 may include the clothes care compartment 12a in which a front surface is open and clothes are received.

The machine room 11b may correspond to a part of the inner space 11a and may be separated from the clothes care compartment 12a by the inner cabinet 12. The machine room 11b may be installed under the clothes care compartment 12a and the rear side of the machine room 11b may be opened. The open rear side of the machine room 11b may be covered by a first housing 120 that is to be described later.

As illustrated in FIG. 3, the machine room 11b may receive a compressor 31, heat exchangers 32 and 33 and an expansion valve (not shown), which constitutes the refrigeration cycle. The heat exchangers 32 and 33 may include a condenser 32 and an evaporator 33.

The machine room 11b may receive a lower fan 34 configured to suction air into the inside of the machine room 11b and lower ducts 35 and 36 configured to guide air suctioned by the lower fan 34. The machine room 11b may receive a steam generator 37 configured to generate steam. In addition, the machine room 11b may receive a printed circuit board assembly 100 configured to control various components of the clothes care apparatus 1.

The door 20 may be rotatably installed on one side of the front surface of the body 10. The door 20 is rotated to open and close the clothes care compartment 12a.

The door 20 may include a control panel 21 configured to allow a user to select an operation of the clothes care apparatus 1. The control panel 21 may be installed on the front surface of the door. The control panel 21 may include a button 21a configured to allow a user to select an operation of the clothes care apparatus 1 by being touched or pushed by the user, and a display 21b configured to display an operation status of the clothes care apparatus 1. Alternatively, without separation between buttons and a display, the control panel 21 may be provided as a display configured to receive a touch input.

The front surface of the outer cabinet 11 may be opened and thus the outer cabinet 11 may receive the inner cabinet 12 through the open front surface. A lower part of a rear surface of the outer cabinet 11 may be opened. In other words, the rear of the machine room 11b may be opened. As described above, the open rear side of the machine room 11b may be covered by the first housing 120. Particularly, the first housing 120 may be coupled to the rear lower side of the outer cabinet 11 to cover the open rear side of the machine room 11b. The first housing 120 may form a rear wall of the machine room 11b.

The inner cabinet 12 may include the clothes care compartment 12a having a front surface opened, an upper cover 12b forming a space, in which a blower 40 is received, above the clothes care compartment 12a, and a lower cover 12c extending downward from a front lower end of the clothes care compartment 12a and covering the front of the machine room 11b.

The blower 40 may be positioned behind the upper cover 12b. The blower 40 may include a driving motor 41 configured to generate a rotational force, a pair of upper fans 42 configured to be rotated by the driving motor 41, and a pair of fan cases 43 configured to receive the pair of upper fan 42.

A shaft of the drive motor 41 protrudes toward opposite sides and thus the upper fan 42 may be coupled to opposite ends of the shaft. With this structure, the pair of upper fans 42 may be rotated by the single driving motor 41.

The pair of upper fans 42 may be provided as a centrifugal fan that suctions air in the axial direction and discharges air radially outward, but is not limited thereto.

A water supply tank 51 and a water drain tank 52 may be detachably installed on the lower cover 12c. The water supply tank 51 and the water drain tank 52 may be separated from the lower cover 12c, respectively. The water supply tank 51 and the water drain tank 52 may be coupled to the lower cover 12c, respectively. The water supply tank 51 may supply water to the steam generator 37. The water drain tank 52 may store water that is condensed such a way that humid air passes through the refrigeration cycle. The position of the water supply tank and water drain tank may vary.

Referring to FIG. 3, a first inlet 12d configured to allow the air in the clothes care compartment 12a to flow into the upper ducts 13 and 14 may be provided at the rear surface of the clothes care compartment 12a. A filter 12e configured to collect foreign matter such as dust may be provided on the front or rear of the first inlet 12d. The filter 12e may include a High Efficiency Particulate Air (HEPA) filter, but is not limited thereto.

A first outlet 12f configured to discharge air of the upper ducts 13 and 14 to the clothes care compartment 12a may be provided on the upper surface of the clothes care compartment 12a.

When the upper fan 42 rotates, the air inside the clothes care compartment 12a may flow into the first upper duct 13 through the first inlet 12d. Foreign matter such as fine dust may be removed by the filter 12e during the air in the clothes care compartment 12a flows into the first upper duct 13. The air flowing into the first upper duct 13 may be moved upward along the first upper duct 13 and suctioned into the upper fan 42. Air discharged from the upper fan 42 may be moved along the second upper duct 14 and discharged into the clothes care compartment 12a through the first outlet 12f provided on the upper surface of the clothes care compartment 12a. A heater 44 configured to heat air may be installed inside the second upper duct 14. By passing through the heater 44, hot air may be discharged into the clothes care compartment 12a through the first outlet 12f.

Referring to FIGS. 3 and 4, a second inlet 53 and a second outlet 54 may be provided on the upper surface of the machine room 11b. The second inlet 53 may be arranged on the lower front of the clothes care compartment 12a and the second outlet 54 may be arranged on the lower rear side of the clothes care compartment 12a. The arrangement of the second inlet and the second outlet may vary.

Air inside the clothes care compartment 12a may flow into the first lower duct 35 through the second inlet 53. One end of the first lower duct 35 may be connected to the second inlet 53 and the other end of the first lower duct 35 may be connected to the lower fan 34. The air flowing into the first lower duct 35 may be moved to the second lower duct 36 through the lower fan 34.

The evaporator 33 and the condenser 32 may be arranged inside the second lower duct 36. The evaporator 33 may absorb heat from the air of the second lower duct 36. The moisture in the air may be condensed by passing through the evaporator 33, and the condensed water may be stored in the water drain tank 52 through a predetermined path. The humidity of the air passing through the evaporator 33 is lowered.

The condenser 32 may be installed on the downstream side of the evaporator 33 in the air flow path. Air having lowered humidity by passing through the evaporator 33 is heated by passing through the condenser 32. After passing through the evaporator 33 and the condenser 32, a temperature of the air becomes higher and a humidity of the air becomes lower. The hot and dry air may be discharged to the clothes care compartment 12a through the second outlet 54.

As mentioned above, air inside the clothes care compartment 12a may flow through the second inlet 53 and pass through the refrigeration cycle and then the air may be discharged through the second outlet 54. By using the process, it is possible to dehumidify the inside of the clothes care compartment 12a and to dry clothes.

The machine room 11b may receive the compressor 31, the steam generator 37, and the printed circuit board assembly 100.

According to an embodiment of the disclosure, the compressor 31 may be an inverter compressor capable of changing the rotation speed or the compression capacity. The inverter compressor is capable of changing the compression capacity through the rotation speed control, thereby controlling heat output of the condenser 32. The inverter compressor may use DC power as a power source. Therefore, an inverter circuit is used to convert AC power to DC power and convert it to a target frequency.

According to an embodiment of the disclosure, the printed circuit board assembly 100 may include an inverter circuit. The inverter circuit may include an intelligent power module (IPM) and a bridge diode, which are provided to control the compressor 31. The inverter circuit may further include a heat sink 102 for cooling the IPM and the bridge diode.

The compressor 31, the steam generator 37, and the printed circuit board assembly 100 each generate heat during operation. Particularly, the printed circuit board assembly 100 including the inverter circuit has the highest heat output, and the printed circuit board assembly 100 is most vulnerable to heat. The printed circuit board assembly 100 is separated from the compressor 31 and the steam generator 37 to prevent the increase in a temperature of the printed circuit board assembly 100 because heat generated by the compressor 31 and the steam generator 37 raises the temperature of the printed circuit board assembly 100. When a distance between the printed circuit board assembly 100 and the compressor 31 and a distance between the printed circuit board assembly 100 and the steam generator 37 are increased, the size of the machine room 11b is increased. When the size of the machine room 11b is increased, the size of the clothes care apparatus 1 is also increased. Accordingly, the marketability of the clothes care apparatus 1 may deteriorate. Therefore, the printed circuit board assembly 100 is separated from the compressor 31 and the steam generator 37 in a limited space in the machine room 11b without increasing the size of the machine room 11b.

According to the disclosure, the printed circuit board assembly 100 may be cooled in a space separated from the compressor 31 and the steam generator 37, which are heating elements.

Referring to FIG. 4, the printed circuit board assembly 100 may be placed in a receiving space 111 formed inside a printed circuit board housing 110. The printed circuit board housing 110 may include the first housing 120 configured to cover the open rear side of the machine room 11b, and a second housing 130 configured to form the receiving space 111 by being coupled to the first housing 120.

The printed circuit board assembly 100 may be installed in the receiving space 111 separated from the machine room 11b. The receiving space 111 may be separated from the machine room 11b by the second housing 130. The second housing 130 may serve as a partition separating the receiving space 111 from the machine room 11b.

The second housing 130 may prevent the heat, which is generated by the compressor 31 and the steam generator 37 placed in the machine room 11b, from being transmitted to the printed circuit board assembly 100. In other words, the second housing 130 may be configured to insulate the receiving space 111. Accordingly, the second housing 130 may be formed of a heat insulating material.

Because the second housing 130 insulates the receiving space 111, it is possible to prevent the temperature of the printed circuit board assembly 100 from rising due to heat generated by the compressor 31 and the steam generator 37. Accordingly, the printed circuit board assembly 100 may be separately cooled from the compressor 31 and the steam generator 37.

According to an embodiment of the disclosure, the first housing 120 may include a first air inlet 121 configured to allow air outside the body 10 to flow into the receiving space 111, an air outlet 123 configured to allow air of the receiving space 111 to be discharged to the outside of the body 10, and a second air inlet 122 configured to allow air outside the body 10 to flow into the machine room 11b.

The first air inlet 121 and the air outlet 123 may be arranged vertically. The first air inlet 121 may be arranged under the air outlet 123.

The first air inlet 121 and the second air inlet 122 may be arranged vertically. The second air inlet 122 may be arranged under the first air inlet 121.

The first air inlet 121 and the second air inlet 122 may be provided in a slit shape extending in the vertical direction. The first air inlet 121 may be provided in plural number, and the plurality of first air inlets 121 may be arranged in parallel in the horizontal direction. The second air inlet 122 may be provided in plural number and the plurality of second air inlets 122 may be arranged in parallel in the horizontal direction.

The number of the first air inlets 121 may be greater than the number of the second air inlets 122. The reason why the number of the first air inlets 121 is greater than the number of the second air inlets 122 is that an amount of the outside air for cooling the printed circuit board assembly 100 is greater than an amount of the outside air for cooling the compressor 31 and the steam generator 37. Further, it is to reduce noise transmitted from the inside of the machine room 11b to the outside of the clothes care apparatus 1. Therefore, the noise of the clothes care apparatus 1 may be reduced.

In a conventional manner, the printed circuit board assembly, the compressor, and the steam generator are arranged inside the machine room without separation. In this case, in order to cool the inside of the machine room, holes, into which the outside air flows, have a large size or a great number. When the number of holes is great or the hole size is large, the noise generated inside the machine room is mostly transmitted to the outside of the clothes care apparatus. Therefore, the noise transmitted to the outside of the machine room is increased and the noise of the clothes care apparatus is increased.

According to the embodiment of the disclosure, it is possible to relatively reduce the number and size of the second air inlets 122 configured to flow air into the machine room 11b. Therefore, it is possible to reduce the noise transmitted to the outside of the machine room 11b and to reduce the noise of the clothes care apparatus 1.

Hereinafter cooling of the printed circuit board assembly 100 will be described.

Because cold air is denser than hot air, cold air moves down, and hot air moves up. Because the first air inlet 121 is arranged under the air outlet 123, relatively cold air may flow into the first air inlet 121. The cold air flowing into the first air inlet 121 may become hot air after absorbing heat generated in the printed circuit board assembly 100, and then the hot air may be discharged to the outside of the body 10 through the air outlet 123. Because the hot air moving over is physical phenomenon caused by the density difference of the air, as mentioned above, cold air may flow into the first air inlet 121 and the hot air may be discharged to the air outlet 123 without an additional blower. Therefore, the printed circuit board assembly 100 may be cooled.

Figure 5:
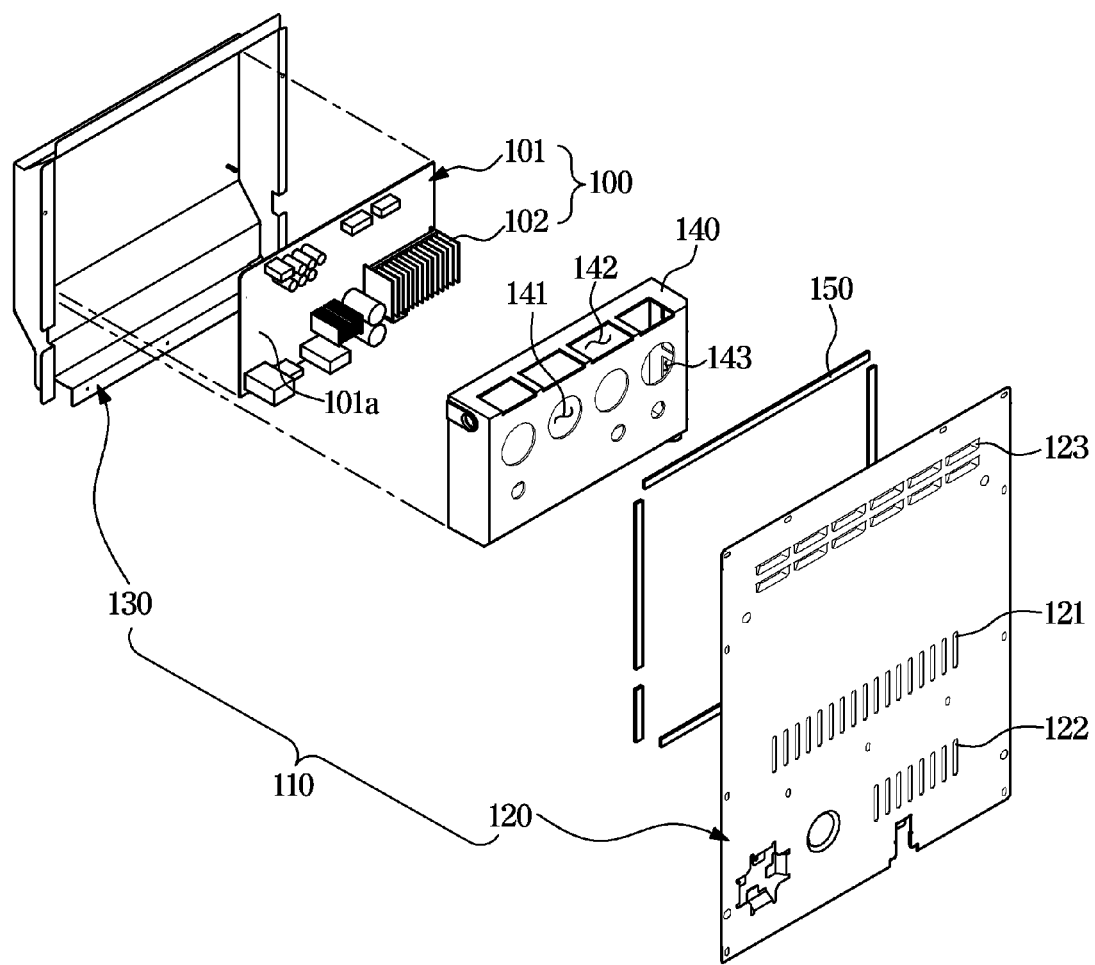
FIG. 5 is an exploded perspective view separately illustrating some components in the clothes care apparatus according to the embodiment of the disclosure.

FIG. 5 is an exploded perspective separately illustrating some components in the clothes care apparatus according to the embodiment of the disclosure.

Referring to FIG. 5, the printed circuit board housing 110 may include the first housing 120 and the second housing 130. The printed circuit board assembly 100 may be arranged between the first housing 120 and the second housing 130.

When the printed circuit board assembly 100 is exposed to the moisture, a short circuit may occur. Therefore, moisture is prevented from flowing into the printed circuit board assembly 100.

The clothes care apparatus 1 may further include a sealing member 150 arranged between the first housing 120 and the second housing 130 to prevent moisture from flowing into the receiving space 111. The sealing member 150 may be provided to eliminate a gap between the first housing 120 and the second housing 130. The sealing member 150 may be installed along the circumference of the second housing 130.

The sealing member 150 may prevent moisture from flowing into the receiving space 111 and thus it is possible to prevent the short circuit of the printed circuit board assembly 100.

The printed circuit board assembly 100 may include a printed circuit board 101 and the heat sink 102 coupled to the printed circuit board 101. The printed circuit board 101 may include a mounting surface 101a on which a plurality of elements and the heat sink 102 are mounted.

The printed circuit board 101 may be arranged such a way that the mounting surface 101a faces the first housing 120. This is to facilitate repair and replacement of the printed circuit board 101.

The clothes care apparatus 1 may further include a cover member 140 arranged between the first housing 120 and the printed circuit board assembly 100. The cover member 140 may be provided to cover one side of the printed circuit board assembly 100. Particularly, the cover member 140 may be provided to cover the mounting surface 101a of the printed circuit board 101.

The cover member 140 may prevent a current from flowing from the printed circuit board assembly 100 to the first housing 120. For this, the cover member 140 may be a non-conductor.

The cover member 140 may include a plurality of holes 141, 142, and 143 configured to allow air to smoothly flow into the printed circuit board assembly 100 in the receiving space 111. The plurality of holes 141 may include a first hole 141 formed on a first surface of the cover member 140, and second and third holes 142 and 143 respectively formed on second and third surfaces bending and extending from the first surface. The number, shape and arrangement of the holes may vary.

In order to prevent a current from flowing from the printed circuit board assembly 100 to the second housing 130, the second housing 130 may be a non-conductor.

Figure 6:
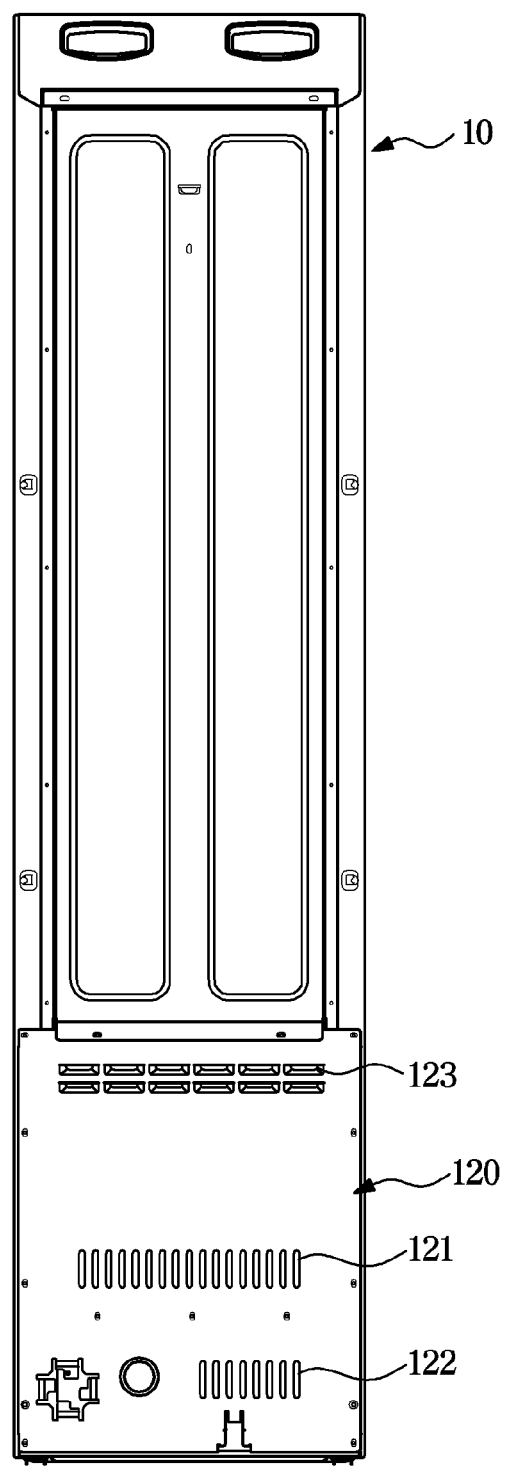
FIG. 6 illustrates a rear view of the clothes care apparatus according to the embodiment of the disclosure.
Figure 7:
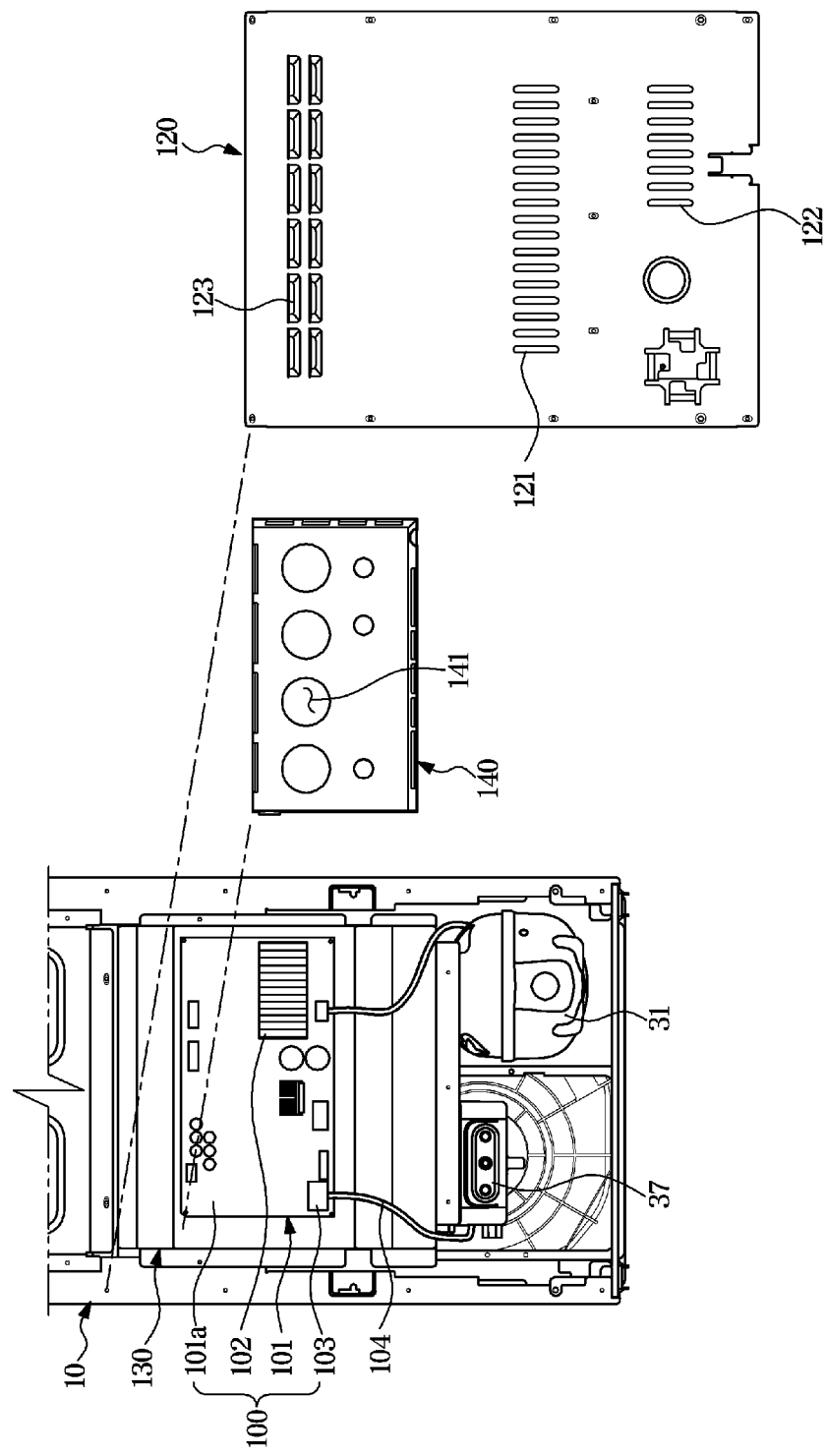
FIG. 7 illustrates an exploded view of some components, particularly, an enlarged view of a part of FIG. 6.

FIG. 6 illustrates a rear view of the clothes care apparatus according to the embodiment of the disclosure. FIG. 7 illustrates an exploded view of some components, particularly, an enlarged view of a part of FIG. 6.

It is convenient to have easy access to the printed circuit board for improving the efficiency of the repair or replacement operation in the printed circuit board assembly 100.

Hereinafter a method for accessing the printed circuit board assembly 100 for replacing or repairing the printed circuit board assembly 100 will be described.

Referring to FIG. 6, the first housing 120 may be provided on the rear surface of the clothes care apparatus 1. As mentioned above, the lower side portion of the rear surface of the outer cabinet 11 may be opened, and the first housing 120 may cover the open rear side of the outer cabinet 11.

Referring to FIG. 7, the first housing 120 may be separated from the outer cabinet 11. When the first housing 120 is separated from the outer cabinet 11, the printed circuit board assembly 100 may be exposed to the rear surface of the body 10.

When the cover member 140 covering the printed circuit board 101 is separated from the second housing 130, the printed circuit board 101 may be exposed to the rear surface of the body 10.

Because the printed circuit board 101 is installed to face the first housing 120, an operator can easily access the mounting surface 101a of the printed circuit board 101 without any additional action.

The mounting surface 101a of the printed circuit board 101 may be provided with a connector 103 to which a wire 104 supplying power to the printed circuit board 101 is connected. The operator can separate the wire 104 from the connector 103 and detach the printed circuit board 101 from the second housing 130 when replacing the printed circuit board 101. Through this process, the operator can easily replace the printed circuit board 101 or repair or replace components on the printed circuit board 101.

Figure 8:
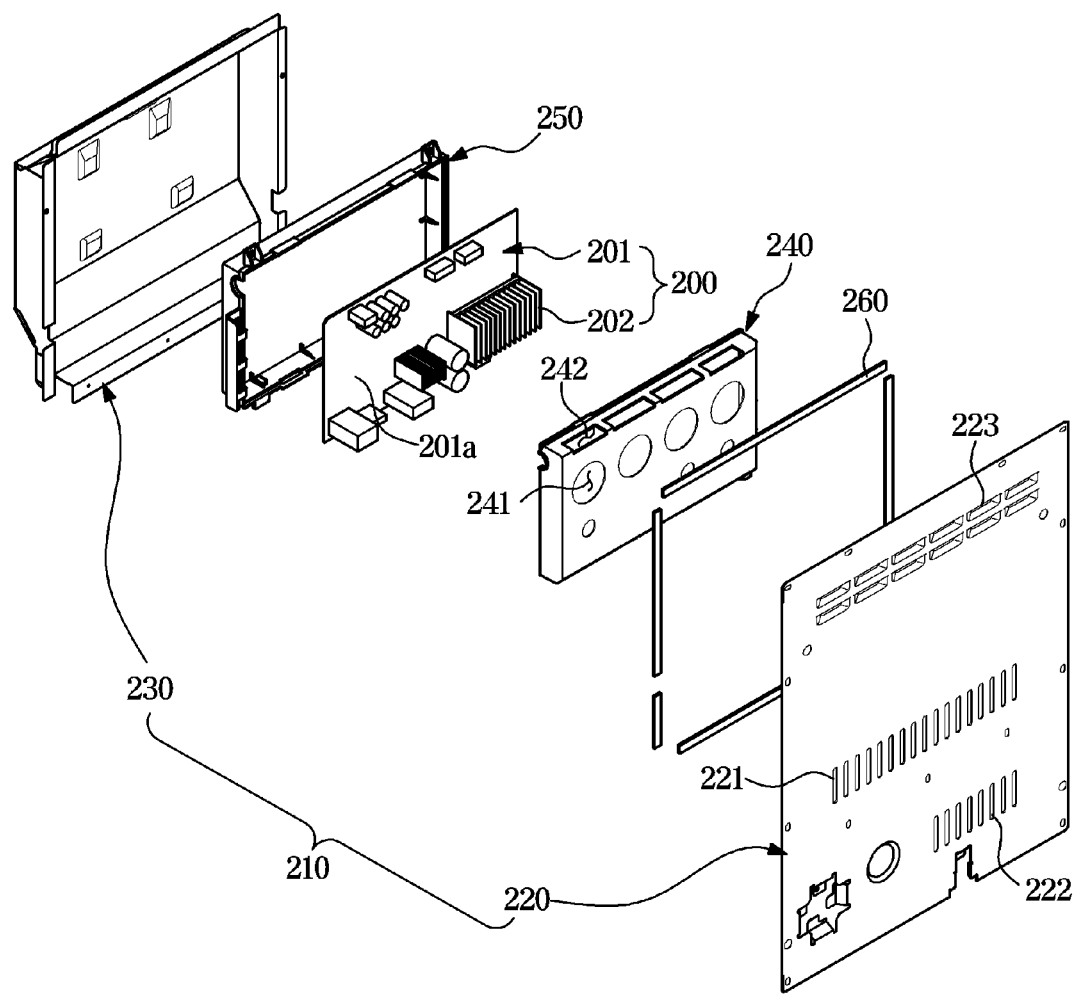
FIG. 8 is an exploded perspective view separately illustrating some components in a clothes care apparatus according to another embodiment of the disclosure.

FIG. 8 is an exploded perspective view separately illustrating some components in a clothes care apparatus according to another embodiment of the disclosure.

Hereinafter a description of the same parts as the above mentioned parts will be omitted.

Referring to FIG. 8, a clothes care apparatus according to another embodiment of the disclosure may further include a second cover member 250.

The second cover member 250 may prevent a current from flowing from a printed circuit board assembly 200 to a second housing 230. The second housing 230 may be formed of a metal material. The second housing 230 may flow a current due to its material properties. The second cover member 250 may be nonconductive to prevent a current from flowing from the printed circuit board assembly 200 to the second housing 230. The second cover member 250 may cover one surface of a printed circuit board 201 opposite to a mounting surface 201a.

Figure 9:
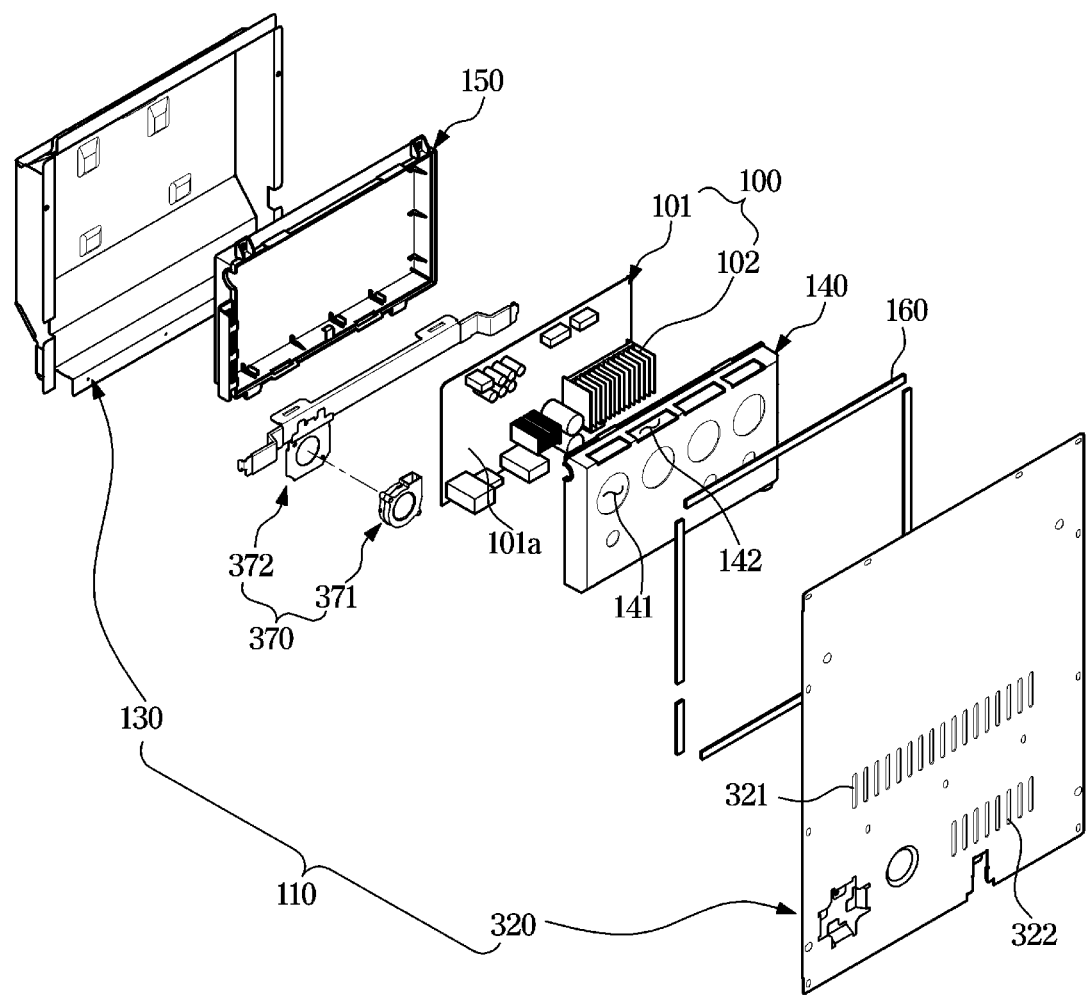
FIG. 9 is an exploded perspective view separately illustrating some components in a clothes care apparatus according to another embodiment of the disclosure.
Figure 10:
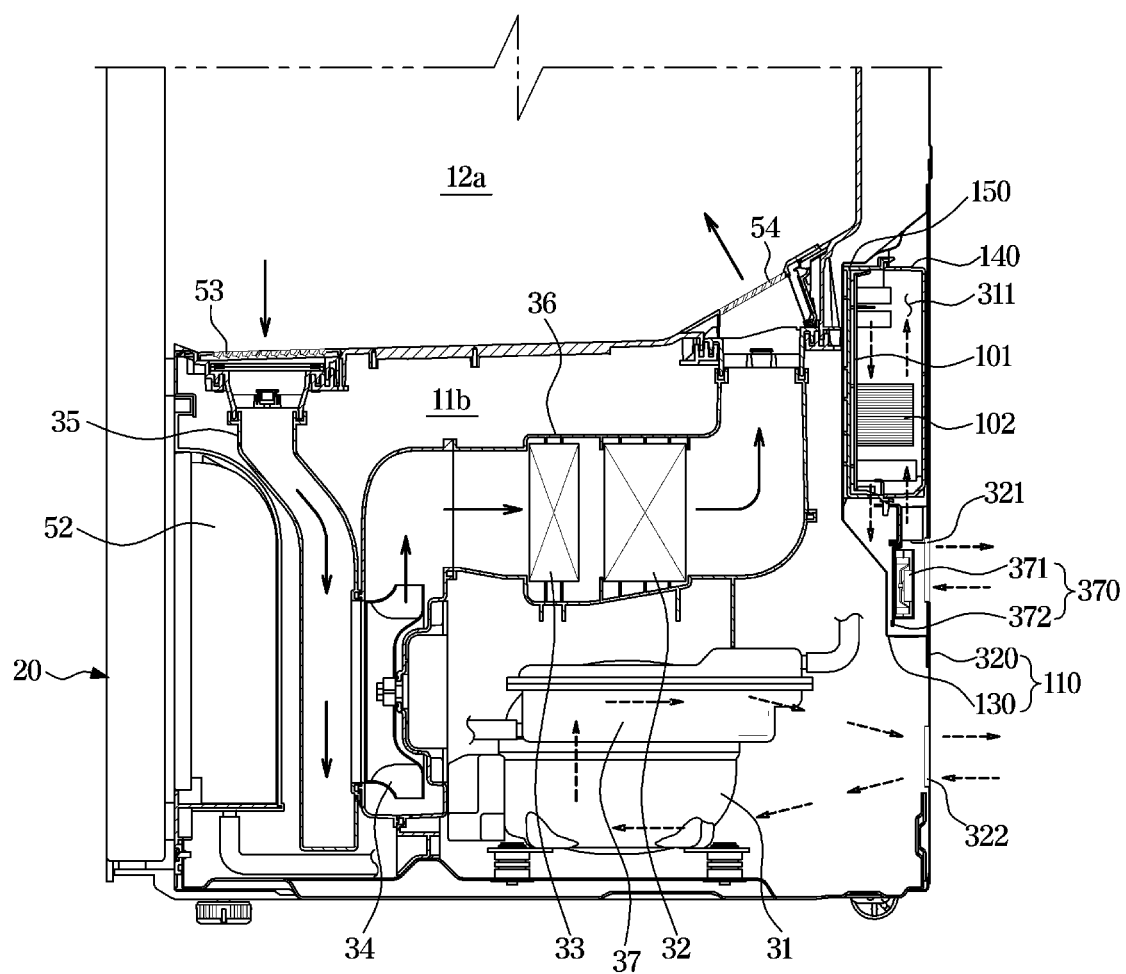
FIG. 10 illustrates an enlarged view of a part, particularly, a cross-sectional side view of the clothes care apparatus according to another embodiment of the disclosure.

FIG. 9 is an exploded perspective view separately illustrating some components in a clothes care apparatus according to another embodiment of the disclosure. FIG. 10 illustrates an enlarged view of a part, particularly, a cross-sectional side view of the clothes care apparatus according to another embodiment of the disclosure.

Referring to FIGS. 9 and 10, a clothes care apparatus according to another embodiment of the disclosure may further include a blower 370.

The blower 370 may include a fan 371 arranged in a receiving space 311 and a fan support 372 configured to support the fan 371.

The fan 371 may be configured to suction air from the outside of a body 10 into the receiving space 311. The fan support 372 may be coupled to a first housing 320. The fan 371 may be coupled to the fan support 372.

The first housing 320 may include a first air inlet 321 and a second air inlet 322, but may not include a separate air outlet.

The fan 371 may be configured to suction air outside the body 10 into the receiving space 311 and to discharge the air in the receiving space 311 to the outside of the body 10.

As is apparent from the above description, a clothes care apparatus may improve cooling performance of a printed circuit board assembly.

A clothes care apparatus may prevent moisture from flowing into a printed circuit board assembly.

A clothes care apparatus may reduce noise caused by components in a machine room.

A clothes care apparatus may have easy access to a printed circuit board assembly.

Although a few embodiments of the present disclosure have been shown and described, it would be appreciated by those skilled in the art that changes may be made in these embodiments without departing from the principles and spirit of the disclosure, the scope of which is defined in the claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. A clothes care apparatus comprising:
    a body;
    a clothes care compartment provided inside the body to receive clothes;
    a machine room provided inside the body and separated from the clothes care compartment;
    a printed circuit board housing forming one side wall of the machine room, forming a partition to separate a receiving space from the machine room, and ventilating the receiving space by circulating a flow of ambient air from outside the body; and
    a printed circuit board assembly arranged in the receiving space to be cooled by the ambient air circulating through the receiving space from the outside of the body.

2. The clothes care apparatus of claim 1, wherein the printed circuit board housing comprises:
    a first housing forming one side wall of the machine room; and
    a second housing forming the receiving space by being coupled to the first housing, and
    partitioning the receiving space from the machine room.

3. The clothes care apparatus of claim 2, wherein the first housing comprises:
    a first air inlet that allows air outside the body to flow into the receiving space; and
    a second air inlet that allows air outside the body to flow into the machine room.

4. The clothes care apparatus of claim 2, wherein:
    the printed circuit board assembly comprises a printed circuit board comprising a mounting surface; and
    the printed circuit board is arranged such that the mounting surface faces the first housing.

5. The clothes care apparatus of claim 2, wherein, by separating the receiving space from the machine room, the second housing prevents heat of the machine room from being transmitted to the receiving space.

6. The clothes care apparatus of claim 2, further comprising a first cover member arranged between the printed circuit board assembly and the first housing to cover one surface of the printed circuit board assembly,
    wherein the first cover member is formed of an insulating material to prevent a current from flowing from the printed circuit board assembly to the first housing.

7. The clothes care apparatus of claim 6, wherein the first cover member comprises a plurality of holes configured to allow air to smoothly flow into the printed circuit board assembly in the receiving space.

8. The clothes care apparatus of claim 6, further comprising a second cover member arranged between the printed circuit board assembly and the second housing to cover a second surface opposite to the one surface of the printed circuit board assembly, wherein the second cover member is formed of an insulating material to prevent a current from flowing from the printed circuit board assembly to the second housing.

9. The clothes care apparatus of claim 3, wherein the first housing further comprises an air outlet arranged above the first air inlet and that allows air of the receiving space to be discharged to the outside of the body.

10. The clothes care apparatus of claim 2, further comprising a sealing member arranged between the first housing and the second housing to prevent moisture from flowing to the receiving space.

11. The clothes care apparatus of claim 3, further comprising a fan arranged in the receiving space to suction air outside the body into the receiving space through the first air inlet.

12. The clothes care apparatus of claim 1, wherein the machine room includes a compressor or a steam generator.

13. The clothes care apparatus of claim 12, wherein the printed circuit board assembly comprises an inverter circuit that changes a driving speed of the compressor by a frequency conversion.

14. The clothes care apparatus of claim 2, wherein the second housing is formed of an insulating material to prevent a current from flowing from the printed circuit board assembly to the second housing.

15. The clothes care apparatus of claim 2, wherein, when the first housing is separated from the body, the printed circuit board assembly and a first cover member are exposed to a rear side of the body to allow access from the rear side of the body.

16. A clothes care apparatus comprising:
a body;
a clothes care compartment provided inside the body;
a machine room provided inside the body under the clothes care compartment;
a printed circuit board housing arranged in the machine room to form a partition to separate a receiving space from the machine room, the printed circuit board housing provided with a first air inlet that flows air outside the body into the receiving space and a second air inlet that flows air outside the body into the machine room; and
a printed circuit board assembly arranged in the receiving space.

17. The clothes care apparatus of claim 16, wherein the printed circuit board housing comprises:
a first housing forming a rear wall of the machine room, and
a second housing forming the receiving space by being coupled to the first housing, and insulating the receiving space from the machine room.

18. The clothes care apparatus of claim 16, wherein:
the first air inlet comprises a plurality of first air inlets;
the second air inlet comprises a plurality of second air inlets; and
a number of the plurality of first air inlets is greater than a number of the plurality of second air inlets.

19. The clothes care apparatus of claim 17, wherein the printed circuit board assembly is arranged to face the first housing such that when the first housing is separated from the body, the printed circuit board assembly is exposed to a rear side of the body.

20. A clothes care apparatus comprising:
an outer cabinet;
a clothes care compartment provided with an open front surface to receive clothes;
an inner cabinet arranged inside the outer cabinet and comprising the clothes care compartment;
a machine room formed between the outer cabinet and the inner cabinet and provided with an open rear surface;
a first housing covering the open rear surface of the machine room to form a rear wall of the machine room;
a second housing coupled to the first housing to form a receiving space separated from the machine room; and
a printed circuit board assembly arranged in the receiving space to face the first housing.

* * * * *